United States Patent [19]

Oyamatsu

[11] Patent Number: 5,512,500
[45] Date of Patent: Apr. 30, 1996

[54] METHOD OF FABRICATING SEMICONDUCTOR DEVICE

[75] Inventor: Hisato Oyamatsu, Tokyo, Japan

[73] Assignee: Kabushiki Kaisha Toshiba, Kawasaki, Japan

[21] Appl. No.: 404,626

[22] Filed: Mar. 14, 1995

[30] Foreign Application Priority Data

Mar. 17, 1994 [JP] Japan .................................. 6-046750

[51] Int. Cl.⁶ ...................... H01L 21/8234; H01L 21/441
[52] U.S. Cl. .............................. 437/40; 437/195; 437/229; 437/233; 437/913
[58] Field of Search .................. 437/40 R, 229, 437/233, 913, 195, 186

[56] References Cited

U.S. PATENT DOCUMENTS

| | | | |
|---|---|---|---|
| 4,898,804 | 2/1990 | Rauschenbach et al. | 437/180 |
| 4,935,377 | 6/1990 | Strifler et al. | 148/DIG. 143 |
| 4,997,780 | 3/1991 | Szluk et al. | 437/41 GS |
| 5,037,772 | 8/1991 | McDonald | 437/233 |
| 5,110,763 | 5/1992 | Matsumoto | 437/195 |

*Primary Examiner*—Brian E. Hearn
*Assistant Examiner*—Michael Trinh
*Attorney, Agent, or Firm*—Loeb and Loeb

[57] ABSTRACT

A method of fabricating a semiconductor device forms a resist pattern for a gate electrode or the like on a semiconductor device in such a manner that only a fine resist pattern is formed on a resist member by an electron beam lithography and other resist patterns are formed on the same resist member by an optical lithography.

4 Claims, 2 Drawing Sheets

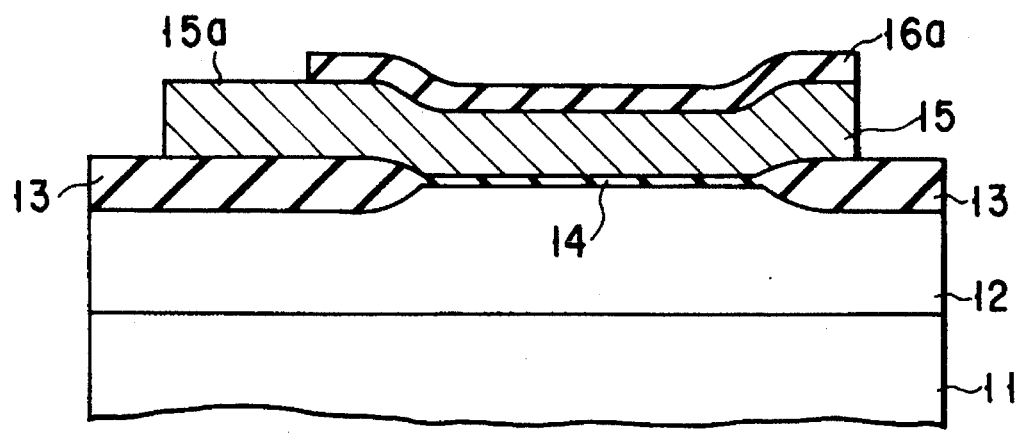
F I G. 4
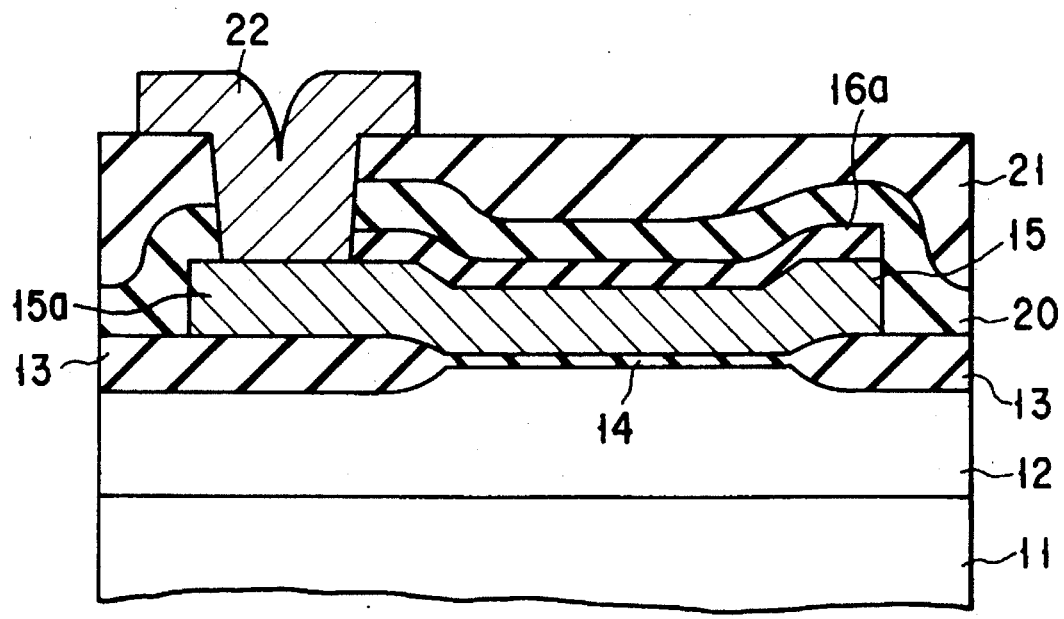
F I G. 5

METHOD OF FABRICATING
SEMICONDUCTOR DEVICE

BACKGROUND OF THE INVENTION

1. Field of the Invention

The present invention relates to a method of fabricating a semiconductor device, which forms a resist pattern corresponding to a gate electrode on a semiconductor device in such a way that only a fine resist pattern is formed on a resist member by an electron beam lithography and other resist patterns are formed on the same resist member by an optical lithography.

2. Description of the Related Art

Recent high integration and high speed of an LSI are accomplished by the miniaturization of device elements.

Conventionally, at the time of forming an nMOSFET as a device element, for example, a resist pattern is formed by patterning a resist member, thereby forming one gate electrode layer 10 as shown in FIG. 1. This gate electrode layer 10 comprises an n type polycrystalline silicon (polysilicon) layer 10a, which becomes a gate electrode of the operational area of the MOSFET, and an n type polysilicon layer 10b, which is a contact portion to other interconnections and where a contact hole 11 is formed. The gate electrode layer 10 has different sizes at the individual portions.

In forming the resist pattern, lithographies are selected in accordance with the sizes of the individual portions. An electron beam lithography may be used for the n type polysilicon layer 10a which is a fine portion, while using an optical lithography for the n type polysilicon layer 10b.

According to the optical lithography technique, normally, a mask for pattern transfer is prepared and is transferred on a resist by a reduced exposure projection scheme, thus forming a desired pattern. The pattern transfer can be accomplished in a short period of time; the transfer time is normally about several hundreds of milliseconds.

The resolution of the optical lithography is limited by the wavelength of light used in the lithography, and this resolution limit is improved by shortening the wavelength of the light in use. Even the lithography technique using a KrF (excimer) laser, which is presently prior art, can form a pattern of as small as about 0.3 µm.

As the electron beam lithography directly forms a resist pattern using an electron beam, a fine pattern of about 0.1 µm can be formed.

The electron beam lithography directly forms every pattern in an LSI with an electron beam. For an LSI which has several tens of millions of transistors and has a gate length of about 0.1 µm, therefore, processing a single wafer takes several hours and the increased processing considerably increases the LSI manufacturing cost.

It is apparent from the above that the optical lithography and the electron beam lithography have merits and demerits. A positive resist member suitable for the wavelength of the light is used in the optical lithography, while a negative resist member is used in the electron beam lithography.

At the time of forming an nMOSFET as a device element, for example, even if there are a fine gate length portion and another gate length portion involved in forming one gate electrode after forming a resist pattern by patterning a resist member, it is troublesome to provide different resist members suitable for the different gate length portions. When a plurality of device elements are provided side by side, in particular, the fabrication becomes complicated. Conventionally, therefore, the optical lithography and the electron beam lithography were not selectively used for one device element using the same resist member in accordance with the different gate lengths of the gate electrode.

If the electron beam lithography is used entirely for the gate electrode, while this lithography technique is suitable for forming a fine gate length portion, it is not suitable for another gate length portion because the processing inevitably takes time and increases the LSI fabrication cost. If the optical lithography is used entirely for the gate electrode, this lithography technique is not suitable for forming a fine gate length portion from the viewpoint of the limited resolution.

SUMMARY OF THE INVENTION

Accordingly, it is an object of the present invention to provide an improved method of fabricating a semiconductor device, which forms a resist pattern for a gate electrode or the like on a semiconductor device in such a way that only a fine resist pattern is formed on a resist member by an electron beam lithography and other resist patterns are formed on the same resist member by an optical lithography.

To achieve the above object, according to one aspect of this invention, a method of fabricating a semiconductor device comprises the steps of:

forming a gate oxide film on a gate substrate;

forming a polycrystalline silicon layer on the gate oxide film;

forming an insulating film as an etching mask on the polycrystalline silicon layer;

forming a first resist pattern on the insulating film by an electron beam lithography;

selectively removing the insulating film with the first resist pattern used as a mask;

forming a second resist pattern on the polycrystalline silicon layer, excluding a portion corresponding to the first resist pattern, by an optical lithography; and selectively removing the polycrystalline silicon layer with the insulating film and the second resist pattern used as a mask.

According to another aspect of this invention, a method of fabricating a semiconductor device comprises the steps of:

forming a gate oxide film on a gate substrate;

forming a polycrystalline silicon layer on the gate oxide film;

forming an insulating film as an etching mask on the polycrystalline silicon layer;

forming a first resist pattern on the insulating film by an optical lithography;

selectively removing the insulating film with the first resist pattern used as a mask;

forming a second resist pattern on the polycrystalline silicon layer, excluding a portion corresponding to the first resist pattern, by an electron beam lithography; and selectively removing the polycrystalline silicon layer with the insulating film and the second resist pattern used as a mask.

The semiconductor device fabrication methods of this invention with the above steps form a resist pattern for a gate electrode or the like on a semiconductor device in such a manner that only a fine resist pattern not resolutable with the optical lithography is formed on a resist member by the electron beam lithography while other resist patterns resolutable with the optical lithography are formed on the same resist member by the optical lithography. Those methods allow semiconductor devices to be manufactured without impairing the productivity, and are particularly effective in manufacturing devices such as an MPU and fast SRAM.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a cross-sectional view showing a fabrication step following that in FIG. 3; and FIG. 5 is a cross-sectional view showing a fabrication step following that in FIG. 4.

DETAILED DESCRIPTION OF THE PREFERRED EMBODIMENTS

A semiconductor device fabrication method according to one preferred embodiment of the present invention will now be described with reference to FIGS. 2 through 5.

FIGS. 2 to 5 exemplarily show a method of forming a MOSFET with different gate lengths on a semiconductor substrate 11.

Figure 1:
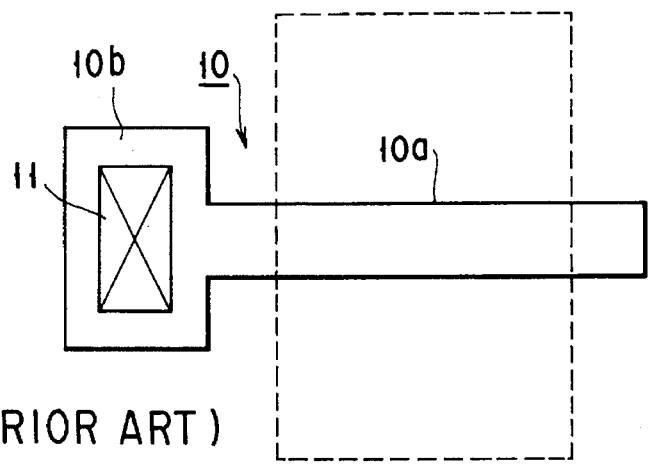
FIG. 1 is a diagram for explaining that at a time of forming an nMOSFET, one gate electrode layer 10 has different sizes at individual portions.
Figure 2:
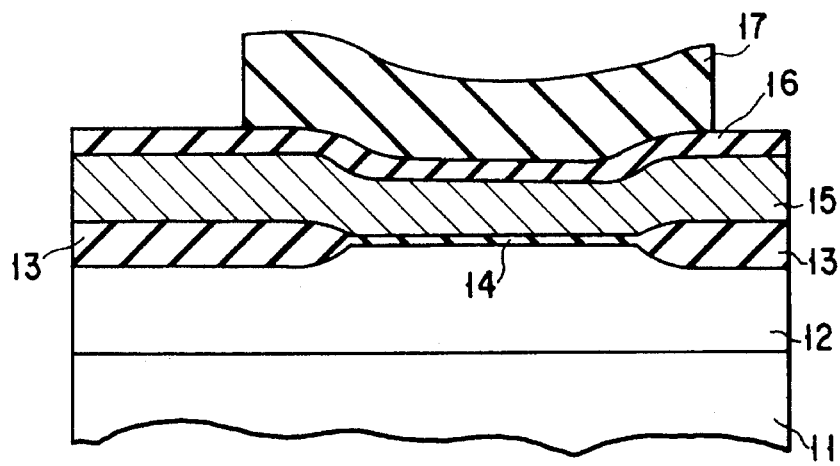
FIG. 2 is a cross-sectional view showing one fabrication step for a semiconductor device according to one embodiment of the present invention.

As shown in FIG. 2, first, a P well 12 is formed on the semiconductor substrate 11, and a thermal oxide film 13 for device isolation is formed on the P well 12 by a LOCOS method. Then, a gate oxide film 14 is formed 7 nm thick by a thermal oxidation method. A polycrystalline silicon (polysilicon) film is deposited 300 nm thick on the entire surface of the resultant structure by an LPCVD method, and As or P impurity ions are added to the polysilicon film to form an n type polysilicon layer 15.

Formed on this polysilicon layer 15 is a silicon oxide film 16 made of a material which has an etch selectivity with the n type polysilicon layer 15. A resist is coated on the silicon oxide film 16.

Then, this resist is patterned directly with the electron beam lithography, forming a resist pattern 17. It is to be noted that the resist pattern formed by the electron beam lithography is only a fine resist pattern not resolutable with the optical lithography. A nitride film may also be used as the film which has an etch selectivity.

Figure 3:
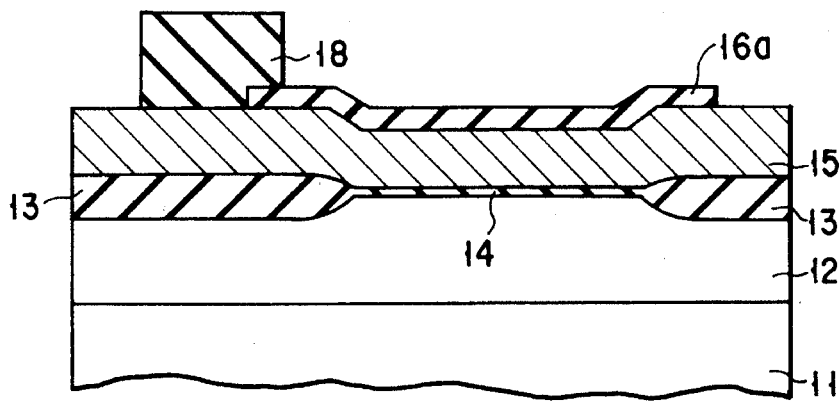
FIG. 3 is a cross-sectional view showing a fabrication step following that in FIG. 2.

Next, with the resist pattern 17 used as a mask, the silicon oxide film 16 is etched to form a silicon oxide film 16a which becomes a mask for a fine gate electrode, as shown in FIG. 3.

Thereafter, a resist is coated on the entire surface of the resultant structure.

Then, a resist pattern 18 is formed using the optical lithography.

Subsequently, with the resist pattern 18 used as a mask, the n type polysilicon layer 15 is etched to form an n type polysilicon layer 15a at gate length portions other than the fine gate length portion of the gate electrode, as shown in FIG. 4. Although not shown in FIG. 4, diffusion layers are formed on the P well 12 by means of ion implantation. These diffusion layers will be used as the source and drain of an nMOSFET.

Next, after an $SiO_2$ film 20 and a BPSG film 21, which become interlayer insulating films, are formed in order by the LPCVD method, a contact hole is formed in the n type polysilicon layer 15 and an Al interconnection layer 22 is formed, as shown in FIG. 5.

As described above, even in forming one gate electrode, the electron beam lithography and the optical lithography are selectively used in accordance with the gate lengths using the same gate member, thereby improving the productivity. For instance, in forming a MOSFET which a fine gate length of less than 0.3 µm, the electron beam lithography is used to form the resist pattern. For a gate length of 0.3 µm or greater, the optical lithography is used to form the resist pattern. Even in fabricating a semiconductor device including a miniaturized MOSFET, therefore, this method can considerably shorten the processing time as compared with the method that uses only the electron beam lithography.

Although the foregoing description covers only the case of the gate electrode formed of polysilicon, even in the case where a metal with a high melting point, like W, Mo, Ni, Co or any of their silicides is deposited on the polysilicon layer in order to reduce the resistance of the gate electrode, the two lithographies can be combined to form the gate electrode if a film which has an etch selectivity with such a metal are formed on the polysilicon layer.

Needless to say, the present method may also be adapted for the case where a resist pattern whose minimum line width is beyond the resolution limited by the optical lithography, beside the case of forming a gate electrode.

Although the formation of a resist pattern by the optical lithography follows the formation of a resist pattern by the electron beam lithography in this embodiment, the order of the processes may be reversed. In this case, first, the resist is coated on the silicon oxide film 16 shown in FIG. 2, and the resist pattern 18 is formed by the optical lithography. At this time, the film to be formed on the polysilicon layer 15 is not limited to the silicon oxide film 16, but a material, which becomes an etching mask at the time of forming the gate electrode as well as a reflection preventing film, may be used instead. This prevents light reflection from the base film when the optical lithography is used, so that the problem of the partial narrowing of the pattern can be coped with.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of fabricating a semiconductor device comprises the steps of:

forming a gate oxide film on a gate substrate;

forming a polycrystalline silicon layer on said gate oxide film;

forming an insulating film as an etching mask on said polycrystalline silicon layer;

forming a first resist pattern on said insulating film by an electron beam lithography;

selectively removing said insulating film with said first resist pattern used as a mask;

forming a second resist pattern on said polycrystalline silicon layer, excluding a portion corresponding to said first resist pattern, by an optical lithography; and selectively removing said polycrystalline silicon layer with said insulating film and said second resist pattern used as a mask.

2. The method according to claim 1, wherein said first resist pattern is a fine resist pattern not resolutable with said optical lithography.

3. A method of fabricating a semiconductor device comprises the steps of:

forming a gate oxide film on a gate substrate;

forming a polycrystalline silicon layer on said gate oxide film;

forming an insulating film as an etching mask on said polycrystalline silicon layer;

forming a first resist pattern on said insulating film by an optical lithography;

selectively removing said insulating film with said first resist pattern used as a mask;

forming a second resist pattern on said polycrystalline silicon layer, excluding a portion corresponding to said first resist pattern, by an electron beam lithography; and selectively removing said polycrystalline silicon layer with said insulating film and said second resist pattern used as a mask.

4. The method according to claim 3, wherein said second resist pattern is a fine resist pattern not resolutable with said optical lithography.

* * * * *